US009967807B2

(12) United States Patent
Pu et al.

(10) Patent No.: US 9,967,807 B2
(45) Date of Patent: May 8, 2018

(54) METHOD OF PROCESSING RECEIVED DIGITIZED SIGNALS AND MOBILE RADIO COMMUNICATION TERMINAL DEVICE

(71) Applicant: Intel IP Corporation, Santa Clara, CA (US)

(72) Inventors: Tian Yan Pu, Dresden (DE); Gunnar Nitsche, Radebeul (DE)

(73) Assignee: Intel IP Corporation, Santa Clara, CA (US)

( * ) Notice: Subject to any disclaimer, the term of this patent is extended or adjusted under 35 U.S.C. 154(b) by 504 days.

(21) Appl. No.: 14/566,736

(22) Filed: Dec. 11, 2014

(65) Prior Publication Data

US 2016/0174138 A1    Jun. 16, 2016

(51) Int. Cl.
*H04L 27/227*  (2006.01)
*H04W 48/16*   (2009.01)
(Continued)

(52) U.S. Cl.
CPC ............... *H04W 48/16* (2013.01); *H03J 7/00* (2013.01); *H04L 27/2278* (2013.01);
(Continued)

(58) Field of Classification Search
CPC .............. H04B 7/0469; H04L 27/2663; H04L 27/2278; H03J 7/00; H01Q 3/385
See application file for complete search history.

(56) References Cited

U.S. PATENT DOCUMENTS

| 7,161,534 B2 | 1/2007 | Tsai et al. |
| 2006/0012520 A1 | 1/2006 | Tsai et al. |

(Continued)

FOREIGN PATENT DOCUMENTS

| EP | 2073576 A1 | 6/2009 |
| WO | 03088076 A2 | 10/2003 |
| WO | 2012062378 A1 | 5/2012 |

OTHER PUBLICATIONS

Office Action including Search Report received for the corresponding TW Patent Application No. 104136666, dated Jul. 29, 2016, 3 pages, and English translation thereof, 3 pages.
(Continued)

*Primary Examiner* — Salvador E Rivas
(74) *Attorney, Agent, or Firm* — Viering, Jentschura & Partner mbB

(57) ABSTRACT

A method of processing a plurality of received digitized signals may include determining a plurality of cross-correlation coefficients for the plurality of received digitized signals; forming a cross-correlation coefficient vector including the plurality of cross-correlation coefficients; and determining an evaluation value for at least some of the plurality of cross-correlation coefficients. The determining the evaluation value may include: pre-selecting a predefined number of cross-correlation coefficients from the cross-correlation coefficient vector and deleting the pre-selected number of cross-correlation coefficients from the cross-correlation coefficient vector; after the pre-selection, determining an averaging value using at least one of the non-preselected cross-correlation coefficients of the cross-correlation coefficient vector; and determining the evaluation values based on the respective value of the pre-selected cross-correlation coefficient and the averaging value. The method may further include selecting one or more cross-correlation coefficients based on the determined evaluation values; and further processing based on the selected one or more cross-correlation coefficients.

17 Claims, 6 Drawing Sheets

(51) Int. Cl.
*H04W 24/08* (2009.01)
*H03J 7/00* (2006.01)
*H04L 27/26* (2006.01)
*H01Q 3/38* (2006.01)

(52) U.S. Cl.
CPC ............ *H04W 24/08* (2013.01); *H01Q 3/385* (2013.01); *H04L 27/2663* (2013.01)

(56) References Cited

U.S. PATENT DOCUMENTS

| | | | |
|---|---|---|---|
| 2007/0183307 A1 | 8/2007 | Akita et al. | |
| 2011/0051857 A1* | 3/2011 | Bernstein | H04L 25/067 375/341 |
| 2013/0273912 A1* | 10/2013 | Xu | H04W 24/08 455/434 |
| 2016/0135188 A1* | 5/2016 | Dhanda | H04W 72/042 370/329 |

OTHER PUBLICATIONS

Extended European search report received for corresponding EP Patent Application No. 15193956.8 dated Jun. 9, 2016, 9 pages.

\* cited by examiner

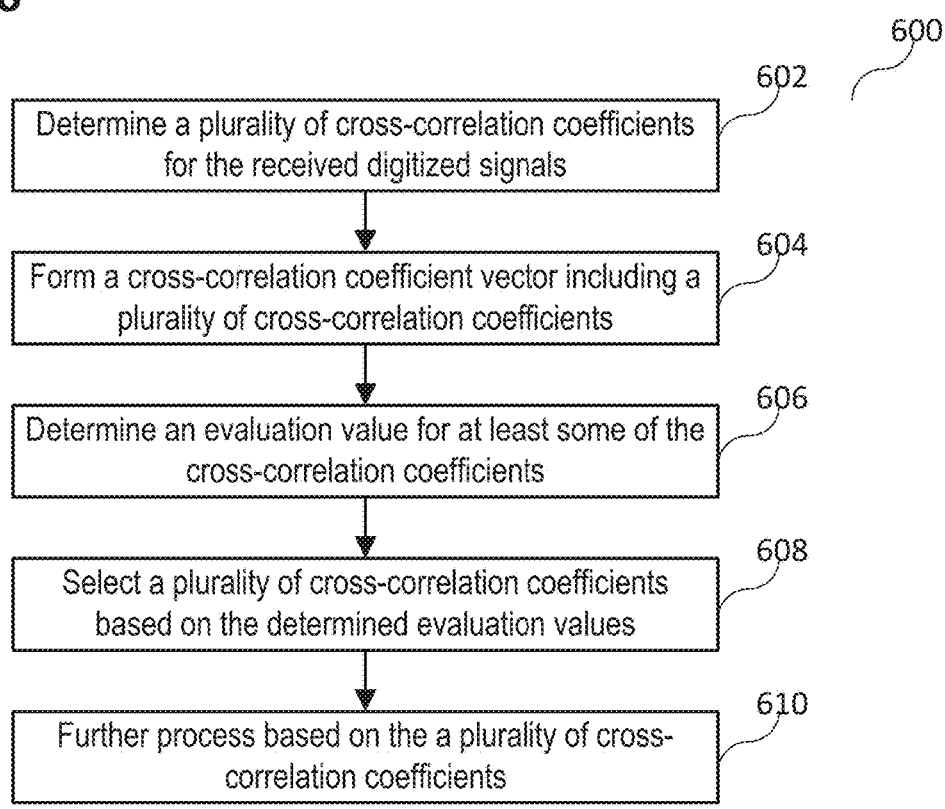

METHOD OF PROCESSING RECEIVED DIGITIZED SIGNALS AND MOBILE RADIO COMMUNICATION TERMINAL DEVICE

TECHNICAL FIELD

Various aspects of this disclosure relate generally to methods of processing a plurality of received digital signals and to mobile radio communication terminal devices.

BACKGROUND

To find all surrounding mobile radio cells, a mobile radio communication terminal device such as a user equipment (UE) usually needs to activate frequency scan and cell scan (also together called Public Land Mobile Network (PLMN) search) procedure in some cases. A typical example is when a user just enters a new country and thus his/her mobile radio communication terminal device does not have any prior knowledge about its surrounding mobile radio communication networks. In these cases, the scan speed may be important, since it directly impacts user experience (a user will probably not be happy if he/she has to wait for a couple of minutes before his/her mobile radio communication terminal device attaches a mobile radio communication network, when for example, he/she walks out of an airplane).

A conventional Public Land Mobile Network (PLMN) search usually consists of two consecutive processes, namely a frequency scan and a mobile radio cell scan. The frequency scan is carried out first for all candidate Enhanced Universal Mobile Telecommunications System (UMTS) Radio Access (E-UTRA) Absolute Radio Frequency Channel Numbers (EARFCNs) to identify frequencies, which most likely contain a mobile radio cell. After the frequency scan, the mobile radio cell scan is carried out for each EARFCN in a so-called short list to check whether there exist mobile radio cells or not.

Several factors together usually contribute to the speed of the frequency/cell scan procedure. They are mainly frequency scan time, quality of frequency scan output (i.e. mobile radio cell scan input), and cell scan time per EARFCN.

In the conventional PLMN search method, the time spent on the frequency scan can be quite long when the number of candidate EARFCNs is high. In a Long Term Evolution (LTE) system, totally 692 EARFCNs are specified.

In a conventional frequency scan, a so-called Received Signal Strength Indication (RSSI)-based frequency scan is used. With RSSI-based frequency scan, time spent during frequency scan is normally short. However, due to its vulnerability to interference from other radio access technology (RAT), the quality of frequency scan output can be quite poor in an LTE mobile radio communication network. Thus, time spent on an entire PLMN search could be quite long and intolerable.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows a flow diagram illustrating a method of processing received digitized signals.

DESCRIPTION

Figure 1:
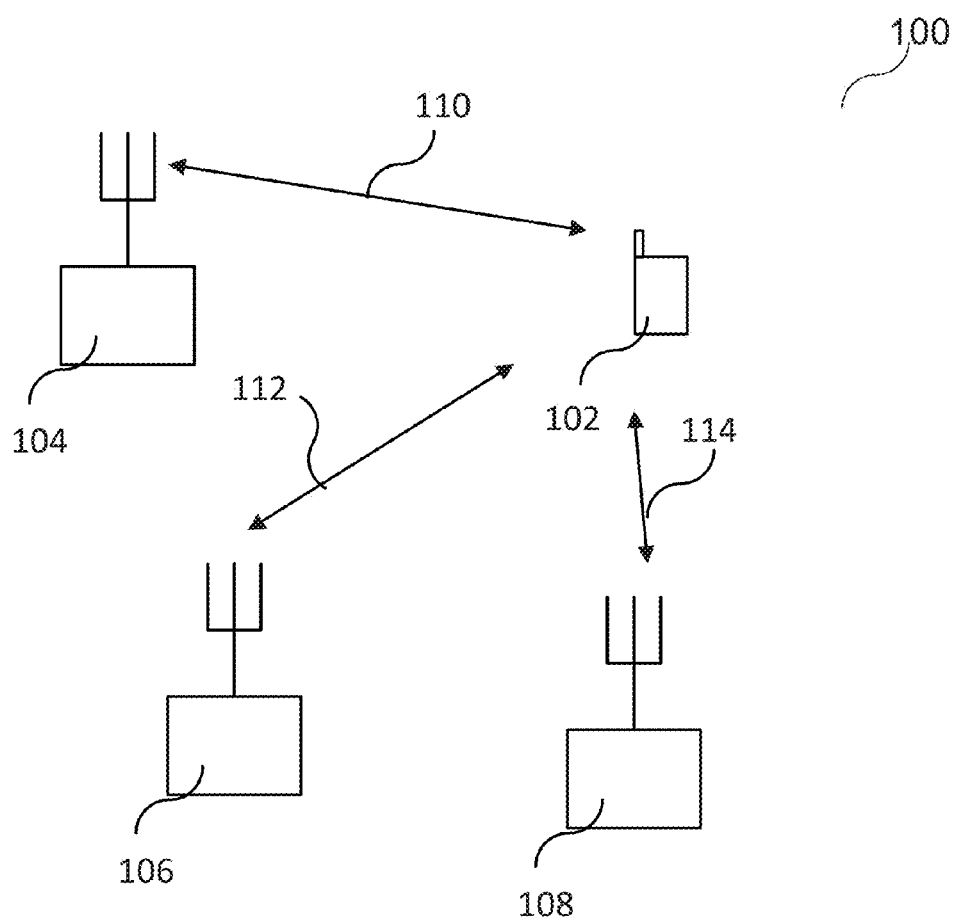
FIG. 1 shows a mobile radio communication system.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

As used herein, a "circuit" may be understood as any kind of a logic implementing entity, which may be special purpose circuitry or a processor executing software stored in a memory, firmware, or any combination thereof. Furthermore, a "circuit" may be a hard-wired logic circuit or a programmable logic circuit such as a programmable processor, for example a microprocessor (for example a Complex Instruction Set Computer (CISC) processor or a Reduced Instruction Set Computer (RISC) processor). A "circuit" may also be a processor executing software, for example any kind of computer program, for example a computer program using a virtual machine code such as for example Java. Any other kind of implementation of the respective functions which will be described in more detail below may also be understood as a "circuit". It may also be understood that any two (or more) of the described circuits may be combined into one circuit.

The quality of frequency scan output may be improved by a post-processing technique to shorten a list of Enhanced Universal Mobile Telecommunications System (UMTS) Radio Access (E-UTRA) Absolute Radio Frequency Channel Numbers (EARFCNs) candidates and to rank them in the list, so that the time of the entire Public Land Mobile Network (PLMN) search procedure can be shortened significantly.

Various aspects of this disclosure provide one or more post-processing methods to improve the quality of frequency scan output (i.e. mobile radio cell scan input) via efficient shorten listing and ranking of EARFCN candidates, as will be described in more detail below. By way of example, based on local cross-correlation function (CCF) peaks and averaged CCF values excluding local CCF peaks and their neighbors, certain signal-to-noise (SNR)-like quality metrics are derived. Only EARFCN candidates with their quality metrics exceeding certain (predefined) design thresholds are further considered for cell scan.

The CCF-scan post-processing method may help to improve the input quality of mobile radio cell scan, thereby possibly shortening mobile radio cell scan time and quality. By way of example, a communication terminal device can detect an empty LTE frequency band more accurately using the described methods. Thus, upon such empty LTE frequency band detection, no or little time needs to be wasted for the mobile radio cell scan. In principle, the conventional RSSI-based method can provide the frequency scan results faster. However, it has been found that much more time may be wasted during a mobile radio cell scan due to wrong downlink (DL) center frequency provided by the frequency scan. It is to be noted that the mobile radio cell scan trial on one EARFCN candidate can take up to one or two hundred milliseconds to complete depending on implementation.

FIG. 1 shows a mobile radio communication system 100. A mobile radio communication terminal device 102 such as e.g. a User Equipment (UE) 102 may receive a plurality of radio signals from one or more base stations such as e.g. NodeBs or eNodeBs 104, 106, 108, e.g. via a respective air interface 110, 112, 114. It is to be noted that although the further description uses a configuration of the mobile radio communication system 100 in accordance with Long Term Evolution (LTE) or in accordance with Long Term Evolution Advanced (LTE-A) for explanation, any other mobile radio communication system 100 may be provided, such as any 3GPP ($3^{rd}$ Generation Partnership Project) mobile radio communication system (e.g. in accordance with Universal Mobile Telecommunications System (UMTS)), 4GPP ($4^{th}$ Generation Partnership Project) mobile radio communication system, and the like.

When the UE 102 is switched on, it searches for a Public Land Mobile Network (PLMN) to camp on. This PLMN search carried out by the UE 102 may include a frequency scan procedure and a mobile radio cell scan procedure, as will be described in more detail below. The UE 102 may receive a plurality of radio signals (also referred to as radio frequency signals (RF signals)).

Figure 2:
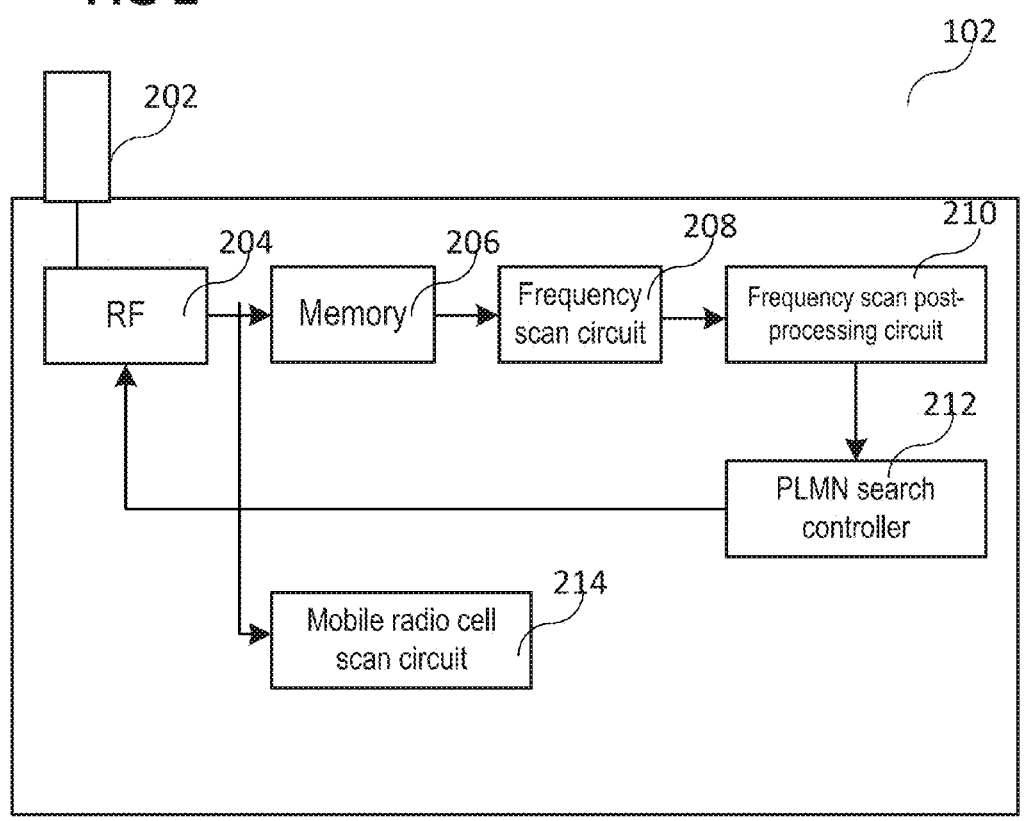
FIG. 2 shows various components and circuits of the UE of FIG. 1.

FIG. 2 shows various components and circuits of the UE 102 provided for and used during the PLMN search. As shown in FIG. 2, the UE 102 may include one or more antennas 202, via which it receives or transmits RF signals. The one or more antennas 202 are coupled with an RF transceiver 204 configured to process the received radio signals, to digitize the received radio signals and to store the digitized received radio signals into a memory 206, e.g. a wideband data buffer 206. Furthermore, the RF transceiver 204 is configured to provide for the transmission of radio signals by e.g. modulating digital signals to analog RF signals. The UE 102 may further include a frequency scan circuit 208 (coupled to the memory 206), a frequency scan post-processing circuit 210 (coupled to the frequency scan circuit 208), a PLMN search controller 212 (coupled to the frequency scan post-processing circuit 210 and to the RF transceiver 204), and a mobile radio cell scan circuit 214 (coupled to the RF transceiver 204). The mentioned circuits may be implemented as separate circuits, e.g. as separate integrated circuits. However, some or all of the circuits (e.g. the frequency scan circuit 208, the frequency scan post-processing circuit 210, the PLMN search controller 212, and/or the mobile radio cell scan circuit 214) may be implemented by one common programmable processor, such as e.g. a microprocessor.

When a user switches on the UE 102, it may search for a PLMN to camp on. In order to do this, the UE 102 may carry out a PLMN search process as will be described in more detail below. The RF transceiver 204 receives radio frequency signals via the one or more antennas 202, and the RF transceiver 204 demodulates and digitizes the radio frequency signals and stores the demodulated and digitized signals (also referred to as wideband data) in the memory 206, e.g. in a wideband data buffer memory 206. The bandwidth and length of the buffered digitized signals may be dependent on the availability of on-chip memory. During the PLMN search, the UE 102 normally does not perform other operations. Therefore, most of on-chip memories (e.g. the HARQ (hybrid automatic repeat request) memory) may be used for buffering the digitized signals.

Furthermore, the frequency scan circuit 208 may carry out a frequency scan process using the buffered (in general stored) digitized signals. The frequency scan circuit 208 may use time-domain cross correlation based primary synchronization signal (PSS) search as frequency scan method. The buffered wideband digitized signals first pass a frequency rotation block, which rotates the center frequency of the input digitized signals. After frequency rotation, the frequency scan circuit 208 decimates the digitized signals to determine narrow band digitized signals, in which PSS and secondary synchronization signal (SSS) are located if there do exist any at all. The effect of using the time-domain cross correlation based frequency scan method may be twofold. First, the results from the frequency scan can be reused during mobile radio cell scan stage, since PSS detection is already performed during frequency scan stage. Second, sensitivity may be much higher compared to other scan methods (e.g. an RSSI based method or an auto-correlation based method).

Figure 3:
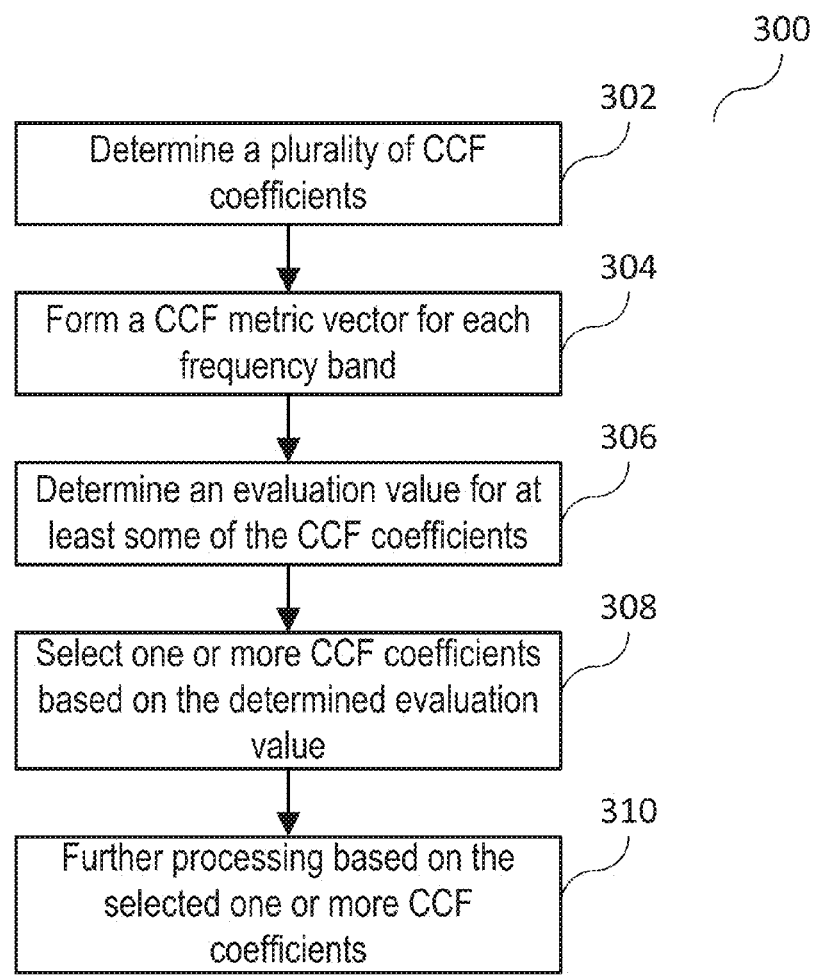
FIG. 3 shows a flow diagram illustrating a PLMN search process.
Figure 4:
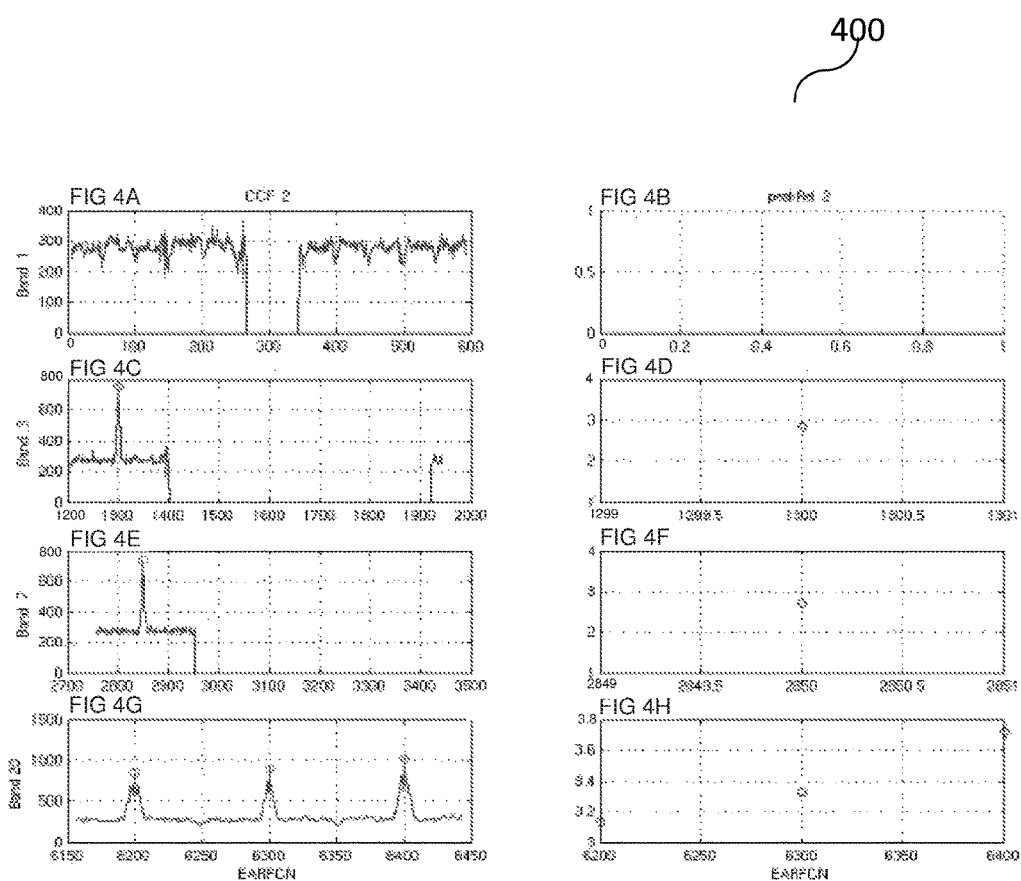
FIGS. 4A to 4H show exemplary test results with over-air data for a frequency scan post-processing process.

The frequency scan circuit 208 may be configured to determine a plurality of cross-correlation coefficients $pcor_{n,1}$ for the received digitized signals (see block 302 in flow diagram 300 in FIG. 3). By way of example, a PSS correlation value calculation per EARFCN may be carried out as shown in Equation (1):

$$pcor_{n,1} = \sum_{m=0}^{M-1} \sum_{k=0}^{K-1} r(m, n-k) * x_1^*(k) \qquad (1)$$

where M stands for the number of half radio frames used for averaging, K stands for length of PSS reference signals, r(m, n) is the nth received sample at the mth half frame signal, $x_1(k)$ is is the kth sample of the lth local PSS reference sequence.

The frequency scan circuit 208 may use the cross-correlation coefficients $pcor_{n,1}$ to form a cross-correlation function (CCF) metric vector obtained during the frequency scan stage for each one of a plurality of frequency bands (see block 304 in flow diagram 300 of FIG. 3). The CCF metric vector may be denoted as CCFM=[$ccfm_0$, $ccfm_1$, $ccfm_2$, ..., $ccfm_{N-2}$, $ccfm_{N-1}$], wherein N is the number of EARFCN hypothesizes inside one respective frequency band.

The frequency scan post-processing circuit 210 may determine or select the respective components of the CCF metric vector CCFM=[$ccfm_0$, $ccfm_1$, $ccfm_2$, ..., $ccfm_{N-2}$, $ccfm_{N-1}$] from the cross-correlation coefficients $pcor_{n,1}$ of equation (1) e.g. by
  selecting the respective maximum value in the respective frequency band; or selecting the respective maximum average value (maximum of the respective cross-correlation coefficients $pcor_{n,1}$ divided by the average value of the cross-correlation coefficients $pcor_{n,1}$ (any desired average metric may be used in this context).

The frequency scan post-processing circuit 210 may carry out the following processes before e.g. the mobile radio cell scan circuit 214 may start the mobile radio cell scan.

In 306, the frequency scan post-processing circuit 210 may determine an evaluation value for at least some of the cross-correlation coefficients (block 306). The frequency scan post-processing circuit 210 may determine the evaluation values e.g. by pre-selecting a predefined number of cross-correlation coefficients from the CCF coefficient vector (also referred to as CCF metric vector) and deleting the pre-selected cross-correlation coefficients from the cross-correlation coefficient vector. In more detail, the frequency scan post-processing circuit 210 may carry out the following processes:

(a) Initialize two arrays CCFMAX and CELL_SCAN_LIST to be empty.

(b) Determine the maximum element (i.e. the CCF coefficient having the maximum value) ccfmax out of the CCF metric vector CCFM=[$ccfm_0$, $ccfm_1$, $ccfm_2$, ..., $ccfm_{N-1}$]. It is to be noted that also the second or third largest CCF coefficient (or even smaller ones) may be determined at this stage, however, determining the maximum element may provide the best results.

(c) Extract ccfmax and its neighboring 2 L metrics out of the CCF metric vector CCFM. L is a design parameter with a typical design value in the range from 3 to 10, e.g. in the range from 5 to 8, e.g. of 7. The extracted ccfmax is appended into the array CCFMAX. In other words, the extracted ccfmax is deleted from the CCF metric vector CCFM. Furthermore, the at least one cross-correlation coefficient representing a neighboring frequency of the frequency of the extracted cross-correlation coefficient ccfmax, e.g. 2 L cross-correlation coefficients representing the 2 L neighboring frequencies of the frequency of the extracted cross-correlation coefficient ccfmax (L in each frequency direction, namely L in frequency direction of smaller frequencies than the frequency of the extracted cross-correlation coefficient ccfmax and L in frequency direction of greater frequencies than the frequency of the extracted cross-correlation coefficient ccfmax) may be deleted from the CCF metric vector CCFM.

Repeat (d) (b) and (c) in an iterative process U times (i.e. the frequency scan post-processing circuit 210 may carry out U iterations) before the main process is continued in (e). U is a design parameter and should be selected based on N and L. By way of example, N may be in the range from 50 to 1000, e.g. in the range from 100 to 700, e.g. approximately 300. Furthermore, U may be in the range from 3 to 30, e.g. in the range from 5 to 20, e.g. 10. It is to be noted that the CCF metric vector CCFM has less CCF vector components after the iterative process than at the beginning thereof, since at least the extracted (pre-selected) cross-correlation coefficients ccfmax (and optionally neighboring cross-correlation coefficients) are deleted from the CCF metric vector CCFM.

(e) After the pre-selection, the frequency scan post-processing circuit 210 may determine an averaging value $ccfm_{avg}$ using at least one of the extracted cross-correlation coefficients of the cross-correlation coefficient vector CCFM. It should be noted that in case coefficients are obtained using other supplemental methods than by a cross-correlation function (e.g. by an auto-correlation methods for quick local empty signal detection), those should be excluded from averaging. The frequency scan post-processing circuit 210 may determine the average value $ccfm_{avg}$ in accordance with difference functions. By way of example, the average value $ccfm_{avg}$ may be the median value of the pre-selected (in other words extracted) cross-correlation coefficients. As an alternative, the frequency scan post-processing circuit 210 may determine the average value $ccfm_{avg}$ in accordance with Equation (2):

$$ccfm_{avg} = \sum_{l=0}^{L-1} \sum_{n=0}^{N-1} \frac{pcor_{n,1}}{(N*L)}. \qquad (2)$$

Any other averaging metric may be used to determine the average value $ccfm_{avg}$ if desired.

(f) Next, the frequency scan post-processing circuit 210 may determine the evaluation values based on the respective value of the pre-selected cross-correlation coefficient and the averaging value. This may be implemented by starting from the first element inside the array CCFMAX, compute a ratio value $ratio_k$ of the k-th element $ccfmax_k$ of the array CCFMAX over the average value ccfmavg in accordance with Equation (3):

$$ratio_k = \frac{ccfmax_k}{ccfm_{avg}}. \qquad (3)$$

If the ratio value $ratio_k$ exceeds a design threshold Thr, the frequency scan post-processing circuit 210 selects the corresponding EARFCN hypothesis (i.e. with frequency scan metric, in other words the respective pre-selected CCF coefficient $ccfmax_k$) as a candidate for a subsequent mobile radio cell scan process and appends it into the candidate array CELL_SCAN_LIST, which it initializes to an empty array at the start as described in (a).

After having completed the previous selection process to completely fill the candidate array CELL_SCAN_LIST, the mobile radio cell scan circuit 214 carries out a mobile radio cell scan for each EARFCN candidate listed in the candidate array CELL_SCAN_LIST, starting from the first element listed in the candidate array CELL_SCAN_LIST. In case the candidate array CELL_SCAN_LIST is still an empty array, the mobile radio cell scan circuit 214 does not need to carry out any mobile radio cell scan. In general, in 308, the frequency scan post-processing circuit 210 selects the one or more cross-correlation coefficients based on the determined evaluation values, and, in 310, e.g. the mobile radio cell scan circuit 214 provides a further processing based on the selected one or more cross-correlation coefficients. Thus, illustratively, the frequency scan post-processing circuit 210 may provide a shortened list including ranked EARFCN candidates in the form of the candidate array CELL_SCAN_LIST to the PLMN search controller 212.

The further processing may be a mobile radio cell scan procedure e.g. initiated by the PLMN search controller 212 and carried out e.g. by the mobile radio cell scan circuit 214, e.g. in accordance with LTE or LTE-A. The mobile radio cell scan procedure is carried out to try to get the mobile radio cell's detailed information (e.g. mobile radio cell ID (identifier), frame time, bandwidth, carrier frequency offset) if there is any. If the cell detection is successful, the UE 102 may camp on the found mobile radio cell and the associated mobile radio network and its mobile radio network operator (MNO). If the cell detection and thus the mobile radio cell scan procedure for the respectively selected CCF coefficient fails, the mobile radio cell scan circuit 214 may select the next CCF coefficient in the candidate array CELL_SCAN_ LIST and carries out the mobile radio cell scan procedure for that next CCF coefficient. The mobile radio cell scan circuit 214 carries out this procedure for all CCF coefficients in the candidate array CELL_SCAN_LIST until either the respective mobile radio cell scan procedure is successful or if the mobile radio cell scan procedure has been carried out for all CCF coefficients in the candidate array CELL_SCAN_LIST. If the mobile radio cell scan procedure fails for all CCF coefficients in the candidate array CELL_SCAN_ LIST, the UE 102 may carry out the entire process for another frequency band, e.g. for another EARFCN, starting with process (a) for the other EARFCN.

As soon as the UE 102 has camped on a mobile radio cell, the UE 102 is ready to establish a mobile radio connection, e.g. an RRC (radio resource connection) mobile radio connection with the respectively selected base station (e.g. NodeB or eNodeB) 104, 106, 108.

The added frequency scan post-processing to shorten and rank the CCF metrics list may improve the quality of the frequency scan output (in term of both misdetection and false alarm rates) so that the mobile radio cell scan speed may be improved.

In various aspects, in general, a feature of the proposed frequency scan post-processing method is to select those EARFCN candidates (if any) for further mobile radio cell scan processing only when all the following conditions are met:

(a) EARFCN hypothesizes with local maximum of CCF metrics.

(b) The ratio of local maximum and average CCF metric exceeds a predefined certain threshold. Note the calculation of CCF metric average should exclude local maximum and its neighbors.

Furthermore, it should be noted that the design parameters especially Thr can be chosen based on a targeted sensitivity. Furthermore, different sets of parameters targeted for different sensitivity level are also possibly designed. They can be used serially by the mobile radio cell scan procedure with the set for lowest sensitivity (i.e. just targeted for a strong mobile radio cell) first, followed by the sets for higher sensitivity (i.e. targeted for a weaker mobile radio cell).

Some trials of the above post-processing method with real-field data were carried out to check its effectiveness beside system level simulation. As an example, FIG. 4A to FIG. 4H illustrate one set of trial results for frequency band 1 (see FIG. 4A and FIG. 4B), 3 (see FIG. 4C and FIG. 4D), 7 (see FIG. 4E and FIG. 4F), 20 (see FIG. 4G and FIG. 4H) respectively. The respective left hand diagrams (i.e. FIG. 4A, FIG. 4C, FIG. 4E, and FIG. 4G) include curves showing (with intermediate zeros due to additional auto-correlation used to do a quick scan in the PLMN search controller, for example). The respective right hand diagrams (i.e. FIG. 4B, FIG. 4D, FIG. 4F, and FIG. 4H) include curves graphically showing the content of the candidate array CELL_SCAN_ LIST with the calculated threshold as described in (f). In these trials, parameters are set as U=10, L=7, Thr=2.0. FIG. 4A to FIG. 4H show that the post-processing method works properly in both non-empty LTE frequency bands (i.e. in this example frequency bands 3, 7, 20) and empty LTE frequency band (i.e. in this example frequency band 1). No good mobile radio cells are missed in non-empty LTE frequency bands and also no false alarm happened in an empty LTE frequency band. Thus, with such an accurate input, total mobile radio cell scan time may be improved significantly.

Various aspects of this disclosure may be applied to carrier aggregation, which as such is e.g. provided in LTE-A.

By way of example, the frequency scan including the determination of the CCF coefficients may be based on PSS sequence cross-correlation. Therefore, beside taking into consideration the determined cross-correlation coefficients (in other words the CCF coefficient values) as the CCF scan metrics, half frame time may also be easily obtained as a side product from the frequency scan procedure. The frame time difference among carrier aggregated mobile radio cells is within certain limit (i.e. e.g. 50 μs). IN this case, attaching to a mobile radio cell which can be aggregated with other mobile radio cells may provide the user equipment (UE) 102 with throughput advantage.

Therefore, in various aspects of this disclosure, during the CCF coefficient ranking as described above, both, the CCF metrics and the possibility of mobile radio cell aggregation may be considered together. The possibility of mobile radio cell aggregation may be derived by checking half frame timing (which is a side product of frequency scan procedure) difference to see whether they are within a predefined certain limit. In this case, a cell aggregation may be provided in case the evaluation value is above the predefined threshold (e.g. Thr) and the half frame timing difference is within a predefined certain limit (in other words below a predefined aggregation threshold). It may even be possible to put high weight on the possibility of aggregation for sake of high throughput.

Figure 5:
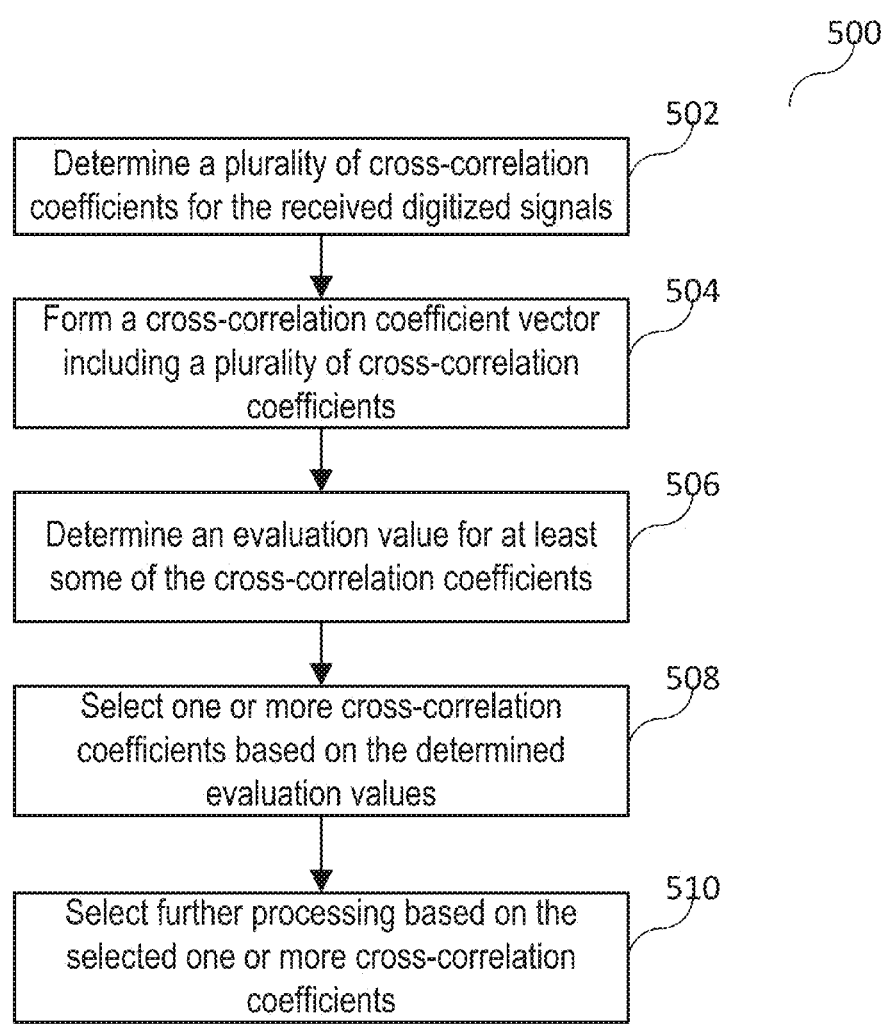
FIG. 5 shows a flow diagram illustrating a method of processing received digitized signals.

FIG. 5 shows a flow diagram 500 illustrating a method of processing received digitized signals.

The method may include, in 502, determining a plurality of cross-correlation coefficients for the received digitized signals, and, in 504, forming a cross-correlation coefficient vector including a plurality of cross-correlation coefficients. The method may further include determining an evaluation value for at least some of the cross-correlation coefficients in 506. The determining an evaluation value for at least some of the cross-correlation coefficients may include pre-selecting a predefined number of cross-correlation coefficients from the cross-correlation coefficient vector and deleting the pre-selected cross-correlation coefficients from the cross-correlation coefficient vector and after the pre-selection, determining an averaging value using at least one of the non-preselected cross-correlation coefficients of the cross-correlation coefficient vector. The determining of the evaluation value may further include determining the evaluation values based on the respective value of the pre-selected cross-correlation coefficient and the averaging value. The method may further include, in 508, selecting one or more cross-correlation coefficients based on the determined evaluation values, and, in 510, further processing (e.g. carrying our a mobile radio cell scan procedure and/or a mobile radio cell aggregation procedure) based on the selected one or more cross-correlation coefficients.

FIG. 6 shows a flow diagram 600 illustrating a method of processing received digitized signals.

The method may include, in 602, determining a plurality of cross-correlation coefficients for the received digitized signals, and, in 604, forming a cross-correlation coefficient vector including a plurality of cross-correlation coefficients. The method may further include, in 606, determining an evaluation value for at least some of the cross-correlation coefficients. The determination of the evaluation may include pre-selecting a predefined number of cross-correlation coefficients from the cross-correlation coefficient vector, and, after the pre-selection, determining an averaging value using at least one of the non-preselected cross-correlation coefficients of the cross-correlation coefficient vector. The determination of the evaluation may further include determining the evaluation values based on the respective value of the pre-selected cross-correlation coefficient and the averaging value. The method may further include, in 608, selecting a plurality of cross-correlation coefficients based on the determined evaluation values, and, in 610, further processing based on the selected plurality of cross-correlation coefficients.

The following examples pertain to further aspects of this disclosure:

Example 1 is a method of processing a plurality of received digitized signals. The method includes determining a plurality of cross-correlation coefficients for the plurality of received digitized signals, and forming a cross-correlation coefficient vector including the plurality of cross-correlation coefficients. The method further includes determining an evaluation value for at least some of the cross-correlation coefficients. The determining an evaluation value for at least some of the cross-correlation coefficients includes pre-selecting a predefined number of cross-correlation coefficients from the cross-correlation coefficient vector and deleting the pre-selected cross-correlation coefficients from the cross-correlation coefficient vector; after the pre-selection, determining an averaging value using at least one of the non-preselected cross-correlation coefficients of the cross-correlation coefficient vector; and determining the evaluation values based on the respective value of the pre-selected cross-correlation coefficient and the averaging value. The method further includes selecting one or more cross-correlation coefficients based on the determined evaluation values; and performing further processing based on the selected one or more cross-correlation coefficients.

In Example 2, the subject matter of Example 1 can optionally include that performing further processing includes performing a mobile radio cell scan for one or more of the selected cross-correlation coefficients to determine a mobile radio communication network to connect to.

In Example 3, the subject matter of Examples 1-2 can optionally include that performing further processing includes performing a carrier aggregation process.

In Example 4, the subject matter of Examples 1-3 can optionally include that the cross-correlation coefficients are part of Enhanced Universal Mobile Telecommunications System Radio Access Absolute Radio Frequency Channel Numbers (EARFCNs).

In Example 5, the subject matter of Examples 1-4 can optionally include that the mobile radio communication network is a Long Term Evolution (LTE) network.

In Example 6, the subject matter of Example 5 can optionally include that the Long Term Evolution network is a Long Term Evolution Advanced (LTE-A) network.

In Example 7, the subject matter of Examples 1-6 can optionally include that the pre-selecting a predefined number of cross-correlation coefficients from the cross-correlation coefficient vector and deleting the pre-selected number of cross-correlation coefficients from the cross-correlation coefficient vector includes performing an iterative process for a predefined number of iterations, including: pre-selecting a cross-correlation coefficient from the cross-correlation coefficient vector which fulfills a predefined pre-selecting criterion; and deleting at least the pre-selected cross-correlation coefficient from the cross-correlation coefficient vector.

In Example 8, the subject matter of Example 7 can optionally include that the pre-selecting a cross-correlation coefficient from the cross-correlation coefficient vector which fulfills a predefined pre-selecting criterion includes pre-selecting the maximum cross-correlation coefficient from the cross-correlation coefficient vector.

In Example 9, the subject matter of Examples 7-8 can optionally include that at least one iteration of the iterative process further includes deleting at least one cross-correlation coefficient representing a neighboring frequency of the frequency of the respectively pre-selected cross-correlation coefficient.

In Example 10, the subject matter of Examples 1-9 can optionally include that the determining the evaluation value includes: determining a ratio value by dividing the respective value of the pre-selected cross-correlation coefficient by the averaging value. The selecting the one or more cross-correlation coefficients out of the pre-selected cross-correlation coefficients may include determining, as to whether the ratio value fulfills a predefined criterion; and selecting the one or more cross-correlation coefficients out of the pre-selected cross-correlation coefficients if the ratio value of the respective pre-selected cross-correlation coefficient fulfills the predefined criterion.

In Example 11, the subject matter of Example 10 can optionally include that the determining, as to whether the ratio value fulfills a predefined criterion includes determining, as to whether the ratio value exceeds a predefined threshold.

In Example 12, the subject matter of Examples 1-11 can optionally include that the plurality of digitized signals are a plurality of digitized radio signals.

Example 13 is a mobile radio communication terminal device, which includes at least one circuit configured to perform a method of processing a plurality of received digitized signals. The method includes determining a plurality of cross-correlation coefficients for the plurality of received digitized signals; forming a cross-correlation coefficient vector including the plurality of cross-correlation coefficients; and determining an evaluation value for at least some of the cross-correlation coefficients. The determining an evaluation value for at least some of the cross-correlation coefficients includes pre-selecting a predefined number of cross-correlation coefficients from the cross-correlation coefficient vector and deleting the pre-selected number of cross-correlation coefficients from the cross-correlation coefficient vector; after the pre-selection, determining an averaging value using at least one of the non-preselected cross-correlation coefficients of the cross-correlation coefficient vector; and determining the evaluation values based on the respective value of the pre-selected cross-correlation coefficient and the averaging value. The method further includes selecting one or more cross-correlation coefficients based on the determined evaluation values; and performing further processing based on the selected one or more cross-correlation coefficients.

In Example 14, the subject matter of Example 13 can optionally include that performing further processing includes performing a mobile radio cell scan for one or more of the selected cross-correlation coefficients to determine a mobile radio communication network to connect to.

In Example 15, the subject matter of Example 13 can optionally include that performing further processing includes performing a carrier aggregation process.

In Example 16, the subject matter of Examples 13-15 can optionally include that the cross-correlation coefficients are part of Enhanced Universal Mobile Telecommunications System Radio Access Absolute Radio Frequency Channel Numbers (EARFCNs).

In Example 17, the subject matter of Examples 13-16 can optionally include that the mobile radio communication terminal device is configured in accordance with Long Term Evolution.

In Example 18, the subject matter of Example 17 can optionally include that the mobile radio communication terminal device is configured in accordance with Long Term Evolution Advanced.

In Example 19, the subject matter of Examples 13-18 can optionally include that the pre-selecting a predefined number of cross-correlation coefficients from the cross-correlation coefficient vector and deleting the pre-selected number of cross-correlation coefficients from the cross-correlation coefficient vector includes performing an iterative process for a predefined number of iterations, including: pre-selecting a cross-correlation coefficient from the cross-correlation coefficient vector which fulfills a predefined pre-selecting criterion; deleting at least the pre-selected cross-correlation coefficient from the cross-correlation coefficient vector.

In Example 20, the subject matter of Example 19 can optionally include that the pre-selecting a cross-correlation coefficient from the cross-correlation coefficient vector which fulfills a predefined pre-selecting criterion includes pre-selecting the maximum cross-correlation coefficient from the cross-correlation coefficient vector.

In Example 21, the subject matter of Examples 19-20 can optionally include that at least one iteration of the iterative process further includes deleting at least one cross-correlation coefficient representing a neighboring frequency of the frequency of the respectively pre-selected cross-correlation coefficient.

In Example 22, the subject matter of Example 13-21 can optionally include that the determining the evaluation value includes determining a ratio value by dividing the respective value of the pre-selected cross-correlation coefficient by the averaging value. The selecting the one or more cross-correlation coefficients out of the pre-selected cross-correlation coefficients may include determining, as to whether the ratio value fulfills a predefined criterion; and selecting the one or more cross-correlation coefficients out of the pre-selected cross-correlation coefficients if the ratio value of the respective pre-selected cross-correlation coefficient fulfills the predefined criterion.

In Example 23, the subject matter of Example 22 can optionally include that the determining, as to whether the ratio value fulfills a predefined criterion includes determining, as to whether the ratio value exceeds a predefined threshold.

In Example 24, the subject matter of Examples 13-23 can optionally include that the plurality of digitized signals are a plurality of digitized radio signals.

Example 25 is a method of processing a plurality of received digitized signals. The method includes determining a plurality of cross-correlation coefficients for the plurality of received digitized signals; forming a cross-correlation coefficient vector including the plurality of cross-correlation coefficients; and determining an evaluation value for at least some of the cross-correlation coefficients. The determining an evaluation value for at least some of the cross-correlation coefficients includes pre-selecting a predefined number of cross-correlation coefficients from the cross-correlation coefficient vector; after the pre-selection, determining an averaging value using at least one of the non-preselected cross-correlation coefficients of the cross-correlation coefficient vector; and determining the evaluation values based on the respective value of the pre-selected cross-correlation coefficient and the averaging value. The method further includes selecting a plurality of cross-correlation coefficients based on the determined evaluation values; and performing further processing based on the selected plurality of cross-correlation coefficients.

In Example 26, the subject matter of Example 25 can optionally include that the determining an evaluation value for at least some of the cross-correlation coefficients further includes deleting the pre-selected number of cross-correlation coefficients from the cross-correlation coefficient vector.

In Example 27, the subject matter of Examples 25-26 can optionally include that performing further processing includes performing a mobile radio cell scan for one or more of the selected cross-correlation coefficients to determine a mobile radio communication network to connect to.

In Example 28, the subject matter of Examples 25-26 can optionally include that performing further processing includes performing a carrier aggregation process.

In Example 29, the subject matter of Examples 25-28 can optionally include that the cross-correlation coefficients are part of Enhanced Universal Mobile Telecommunications System Radio Access Absolute Radio Frequency Channel Numbers (EARFCNs).

In Example 30, the subject matter of Examples 25-29 can optionally include that the mobile radio communication network is a Long Term Evolution (LTE) network.

In Example 31, the subject matter of Example 30 can optionally include that the Long Term Evolution network is a Long Term Evolution Advanced (LTE-A) network.

In Example 32, the subject matter of Examples 25-31 can optionally include that the pre-selecting a predefined number of cross-correlation coefficients from the cross-correlation coefficient vector and deleting the pre-selected number of cross-correlation coefficients from the cross-correlation coefficient vector includes performing an iterative process for a predefined number of iterations, including: pre-selecting a cross-correlation coefficient from the cross-correlation coefficient vector which fulfills a predefined pre-selecting criterion; and deleting at least the pre-selected cross-correlation coefficient from the cross-correlation coefficient vector.

In Example 33, the subject matter of Example 32 can optionally include that the pre-selecting a cross-correlation coefficient from the cross-correlation coefficient vector which fulfills a predefined pre-selecting criterion includes pre-selecting the maximum cross-correlation coefficient from the cross-correlation coefficient vector.

In Example 34, the subject matter of Examples 32-33 can optionally include that at least one iteration of the iterative process further includes deleting at least one cross-correlation coefficient representing a neighboring frequency of the frequency of the respectively pre-selected cross-correlation coefficient.

In Example 35, the subject matter of Examples 25-34 can optionally include that the determining the evaluation value includes determining a ratio value by dividing the respective value of the pre-selected cross-correlation coefficient by the averaging value. The selecting the one or more cross-correlation coefficients out of the pre-selected cross-correlation coefficients may include determining, as to whether the ratio value fulfills a predefined criterion; and selecting the one or more cross-correlation coefficients out of the pre-selected cross-correlation coefficients if the ratio value of the respective pre-selected cross-correlation coefficient fulfills the predefined criterion.

In Example 36, the subject matter of Example 35 can optionally include that the determining, as to whether the ratio value fulfills a predefined criterion includes determining, as to whether the ratio value exceeds a predefined threshold.

In Example 37, the subject matter of Examples 25-36 can optionally include that the plurality of digitized signals are a plurality of digitized radio signals.

Example 38 is a mobile radio communication terminal device. The mobile radio communication terminal device includes at least one circuit configured to perform a method of processing a plurality of received digitized signals. The method includes determining a plurality of cross-correlation coefficients for the plurality of received digitized signals; forming a cross-correlation coefficient vector including the plurality of cross-correlation coefficients; determining an evaluation value for at least some of the cross-correlation coefficients. The determining an evaluation value for at least some of the cross-correlation coefficients includes pre-selecting a predefined number of cross-correlation coefficients from the cross-correlation coefficient vector; after the pre-selection, determining an averaging value using at least one of the non-preselected cross-correlation coefficients of the cross-correlation coefficient vector; and determining the evaluation values based on the respective value of the pre-selected cross-correlation coefficient and the averaging value. The method further includes selecting a plurality of cross-correlation coefficients based on the determined evaluation values; and performing further processing based on the selected a plurality of cross-correlation coefficients.

In Example 39, the subject matter of Example 38 can optionally include that the determining an evaluation value for at least some of the cross-correlation coefficients further includes deleting the pre-selected number of cross-correlation coefficients from the cross-correlation coefficient vector.

In Example 40, the subject matter of Examples 38-39 can optionally include that performing further processing includes performing a mobile radio cell scan for one or more of the selected cross-correlation coefficients to determine a mobile radio communication network to connect to.

In Example 41, the subject matter of Examples 38-39 can optionally include that performing further processing includes performing a carrier aggregation process.

In Example 42, the subject matter of Examples 38-41 can optionally include that the cross-correlation coefficients are part of Enhanced Universal Mobile Telecommunications System Radio Access Absolute Radio Frequency Channel Numbers (EARFCNs).

In Example 43, the subject matter of Examples 38-42 can optionally include that the mobile radio communication terminal device is configured in accordance with Long Term Evolution.

In Example 44, the subject matter of Example 43 can optionally include that the mobile radio communication terminal device is configured in accordance with Long Term Evolution Advanced.

In Example 45, the subject matter of Examples 38-44 can optionally include that the pre-selecting a predefined number of cross-correlation coefficients from the cross-correlation coefficient vector and deleting the pre-selected number of cross-correlation coefficients from the cross-correlation coefficient vector includes performing an iterative process for a predefined number of iterations, including: pre-selecting a cross-correlation coefficient from the cross-correlation coefficient vector which fulfills a predefined pre-selecting criterion; deleting at least the pre-selected cross-correlation coefficient from the cross-correlation coefficient vector.

In Example 46, the subject matter of Example 45 can optionally include that the pre-selecting a cross-correlation coefficient from the cross-correlation coefficient vector which fulfills a predefined pre-selecting criterion includes pre-selecting the maximum cross-correlation coefficient from the cross-correlation coefficient vector.

In Example 47, the subject matter of Examples 45-46 can optionally include that at least one iteration of the iterative process further includes deleting at least one cross-correlation coefficient representing a neighboring frequency of the frequency of the respectively pre-selected cross-correlation coefficient.

In Example 48, the subject matter of Examples 38-47 can optionally include that the determining the evaluation value includes determining a ratio value by dividing the respective value of the pre-selected cross-correlation coefficient by the averaging value. The selecting the one or more cross-correlation coefficients out of the pre-selected cross-correlation coefficients may include: determining, as to whether the ratio value fulfills a predefined criterion; and selecting the one or more cross-correlation coefficients out of the pre-selected cross-correlation coefficients if the ratio value of the respective pre-selected cross-correlation coefficient fulfills the predefined criterion.

In Example 49, the subject matter of Example 48 can optionally include that the determining, as to whether the ratio value fulfills a predefined criterion includes determining, as to whether the ratio value exceeds a predefined threshold.

In Example 50, the subject matter of Examples 38-49 can optionally include that the plurality of digitized signals are a plurality of digitized radio signals.

Example 51 is a mobile radio communication terminal device, including: a first circuit configured to determine a plurality of cross-correlation coefficients for a plurality of received digitized signals; a second circuit configured to form a cross-correlation coefficient vector including the plurality of cross-correlation coefficients; a third circuit configured to determine an evaluation value for at least some of the plurality of cross-correlation coefficients; wherein the third circuit is further configured to: pre-select a predefined number of cross-correlation coefficients from the cross-correlation coefficient vector and delete the pre-selected number of cross-correlation coefficients from the cross-correlation coefficient vector; after the pre-selection, determine an averaging value using at least one of the non-preselected cross-correlation coefficients of the cross-correlation coefficient vector; and determine the evaluation values based on the respective value of the pre-selected cross-correlation coefficient and the averaging value; a fourth circuit configured to select one or more cross-correlation coefficients based on the determined evaluation values; and a fifth circuit configured to perform a further process based on the selected one or more cross-correlation coefficients.

In Example 52, the subject matter of Example 51 can optionally include that the fifth circuit is further adapted to perform a mobile radio cell scan for one or more of the selected cross-correlation coefficients to determine a mobile radio communication network to connect to.

In Example 53, the subject matter of Example 51 can optionally include that the fifth circuit is further adapted to perform a carrier aggregation process.

In Example 54, the subject matter of any one of Examples 51 to 53 can optionally include that the cross-correlation coefficients are part of Enhanced Universal Mobile Telecommunications System Radio Access Absolute Radio Frequency Channel Numbers (EARFCNs).

In Example 55, the subject matter of any one of Examples 51 to 54 can optionally include that it is configured in accordance with Long Term Evolution.

In Example 56, the subject matter of Example 55 can optionally include that it is configured in accordance with Long Term Evolution Advanced.

In Example 57, the subject matter of any one of Examples 51 to 56 can optionally include that the third circuit is further configured to perform an iterative process for a predefined number of iterations, including: pre-selecting a cross-correlation coefficient from the cross-correlation coefficient vector which fulfills a predefined pre-selecting criterion; deleting at least the pre-selected cross-correlation coefficient from the cross-correlation coefficient vector.

In Example 58, the subject matter of Example 57 can optionally include that the third circuit is further configured to pre-select the maximum cross-correlation coefficient from the cross-correlation coefficient vector as the predefined pre-selecting criterion.

In Example 59, the subject matter of any one of Examples 57 or 58 can optionally include that the third circuit is further configured to delete in at least one iteration of the iterative process at least one cross-correlation coefficient representing a neighboring frequency of the frequency of the respectively pre-selected cross-correlation coefficient.

In Example 60, the subject matter of any one of Examples 51 to 59 can optionally include that the third circuit is adapted to determine the evaluation value by determining a ratio value by dividing the respective value of the pre-selected cross-correlation coefficient by the averaging value; wherein the fourth circuit is adapted to select the one or more cross-correlation coefficients out of the pre-selected cross-correlation coefficients by determining, as to whether the ratio value fulfills a predefined criterion; and by selecting the one or more cross-correlation coefficients out of the pre-selected cross-correlation coefficients if the ratio value of the respective pre-selected cross-correlation coefficient fulfills the predefined criterion.

In Example 61, the subject matter of Example 60 can optionally include that the third circuit is adapted to determine, as to whether the ratio value fulfills a predefined criterion comprises by determining, as to whether the ratio value exceeds a predefined threshold.

In Example 62, the subject matter of any one of Examples 51 to 61 can optionally include that the plurality of digitized signals are a plurality of digitized radio signals.

Example 63 is a mobile radio communication terminal device, including: a first circuit configured to determine a plurality of cross-correlation coefficients for a plurality of received digitized signals; a second circuit configured to form a cross-correlation coefficient vector including the plurality of cross-correlation coefficients; a third circuit configured to determine an evaluation value for at least some of the plurality of cross-correlation coefficients; wherein the third circuit is further configured to: pre-select a predefined number of cross-correlation coefficients from the cross-correlation coefficient vector; after the pre-selection, determine an averaging value using at least one of the non-preselected cross-correlation coefficients of the cross-correlation coefficient vector; and determine the evaluation values based on the respective value of the pre-selected cross-correlation coefficient and the averaging value; a fourth circuit configured to select a plurality of cross-correlation coefficients based on the determined evaluation values; and a fifth circuit configured to perform a further process based on the selected plurality of cross-correlation coefficients.

In Example 64, the subject matter of Example 63 can optionally include that the third circuit is adapted to delete the pre-selected number of cross-correlation coefficients from the cross-correlation coefficient vector.

In Example 65, the subject matter of any one of Examples 63 or 64 can optionally include that the third circuit is adapted to perform a mobile radio cell scan for one or more of the selected cross-correlation coefficients to determine a mobile radio communication network to connect to.

In Example 66, the subject matter of any one of Examples 63 or 64 can optionally include that the third circuit is adapted to perform a carrier aggregation process.

In Example 67, the subject matter of any one of Examples 63 to 66 can optionally include that the cross-correlation coefficients are part of Enhanced Universal Mobile Telecommunications System Radio Access Absolute Radio Frequency Channel Numbers (EARFCNs).

In Example 68, the subject matter of any one of Examples 63 to 67 can optionally include that it is configured in accordance with Long Term Evolution.

In Example 69, the subject matter of Example 68 can optionally include that it is configured in accordance with Long Term Evolution Advanced.

In Example 70, the subject matter of any one of Examples 63 to 69 can optionally include that the third circuit is configured to pre-select a predefined number of cross-correlation coefficients from the cross-correlation coefficient vector and deleting the pre-selected number of cross-correlation coefficients from the cross-correlation coefficient vector in an iterative process carried out for a predefined number of iterations, including: pre-selecting a cross-correlation coefficient from the cross-correlation coefficient vector which fulfills a predefined pre-selecting criterion; deleting at least the pre-selected cross-correlation coefficient from the cross-correlation coefficient vector.

In Example 71, the subject matter of Example 70 can optionally include that the third circuit is further adapted to pre-select a cross-correlation coefficient from the cross-correlation coefficient vector which fulfills a predefined pre-selecting criterion by pre-selecting the maximum cross-correlation coefficient from the cross-correlation coefficient vector.

In Example 72, the subject matter of any one of Examples 70 or 71 can optionally include that at least one iteration of the iterative process further comprises deleting at least one cross-correlation coefficient representing a neighboring frequency of the frequency of the respectively pre-selected cross-correlation coefficient.

In Example 73, the subject matter of any one of Examples 63 to 72 can optionally include that the third circuit is configured to determine the evaluation value by determining a ratio value by dividing the respective value of the pre-selected cross-correlation coefficient by the averaging value; wherein the fourth circuit is configured to select the one or more cross-correlation coefficients out of the pre-selected cross-correlation coefficients by determining, as to whether the ratio value fulfills a predefined criterion; and by selecting the one or more cross-correlation coefficients out of the pre-selected cross-correlation coefficients if the ratio value of the respective pre-selected cross-correlation coefficient fulfills the predefined criterion.

In Example 74, the subject matter of Example 73 can optionally include that the fourth circuit is configured to determine, as to whether the ratio value fulfills a predefined criterion by determining, as to whether the ratio value exceeds a predefined threshold.

In Example 75, the subject matter of any one of Examples 63 to 74 can optionally include that the plurality of digitized signals are a plurality of digitized radio signals.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of processing a plurality of received digitized signals, the method comprising:
    determining a plurality of cross-correlation coefficients for the plurality of received digitized signals;
    forming a cross-correlation coefficient vector including the plurality of cross-correlation coefficients;
    determining an evaluation value for at least some of the plurality of cross-correlation coefficients comprising:
        pre-selecting a predefined number of cross-correlation coefficients from the cross-correlation coefficient vector and deleting the pre-selected number of cross-correlation coefficients from the cross-correlation coefficient vector;
        after the pre-selection, determining an averaging value using at least one of the non-preselected cross-correlation coefficients of the cross-correlation coefficient vector; and
        determining the evaluation value based on the respective value of the pre-selected cross-correlation coefficient and the averaging value;
    selecting one or more cross-correlation coefficients based on the determined evaluation value; and
    performing a scan based on the selected one or more cross-correlation coefficients.

2. The method of claim 1,
    wherein performing further processing comprises performing a carrier aggregation process.

3. The method of claim 1,
    wherein the cross-correlation coefficients are part of Enhanced Universal Mobile Telecommunications System Radio Access Absolute Radio Frequency Channel Numbers (EARFCNs).

4. The method of claim 1,
    wherein the pre-selecting a predefined number of cross-correlation coefficients from the cross-correlation coefficient vector and deleting the pre-selected number of cross-correlation coefficients from the cross-correlation coefficient vector comprises performing an iterative process for a predefined number of iterations, comprising:
        pre-selecting a cross-correlation coefficient from the cross-correlation coefficient vector which fulfills a predefined pre-selecting criterion;
        deleting at least the pre-selected cross-correlation coefficient from the cross-correlation coefficient vector.

5. The method of claim 1,
    wherein the determining the evaluation value comprises:
        determining a ratio value by dividing the respective value of the pre-selected cross-correlation coefficient by the averaging value;
    wherein the selecting the one or more cross-correlation coefficients out of the pre-selected cross-correlation coefficients comprises:
        determining, as to whether the ratio value fulfills a predefined criterion; and selecting the one or more cross-correlation coefficients out of the pre-selected cross-correlation coefficients if the ratio value of the respective pre-selected cross-correlation coefficient fulfills the predefined criterion.

6. The method of claim 5,
    wherein the determining, as to whether the ratio value fulfills a predefined criterion comprises determining, as to whether the ratio value exceeds a predefined threshold.

7. The method of claim 1,
    wherein the plurality of cross-correlation coefficients are determined from a time-domain cross-correlation based frequency scanning method using the plurality of received digitized signals.

8. The method of claim 1, wherein performing the scan further comprises identifying mobile radio cells and/or cell base stations.

9. A mobile radio communication terminal device, comprising:
    a first circuit configured to determine a plurality of cross-correlation coefficients for a plurality of received digitized signals;
    a second circuit configured to form a cross-correlation coefficient vector including the plurality of cross-correlation coefficients; a third circuit configured to determine an evaluation value for at least some of the plurality of cross-correlation coefficients;
    wherein the third circuit is further configured to:
        pre-select a predefined number of cross-correlation coefficients from the cross-correlation coefficient vector and delete the pre-selected number of cross-correlation coefficients from the cross-correlation coefficient vector;
        after the pre-selection, determine an averaging value using at least one of the non-preselected cross-correlation coefficients of the cross-correlation coefficient vector; and
        determine the evaluation values based on the respective value of the pre-selected cross-correlation coefficient and the averaging value;
    a fourth circuit configured to select one or more cross-correlation coefficients based on the determined evaluation values; and
    a fifth circuit configured to perform a scan based on the selected one or more cross-correlation coefficients.

10. The mobile radio communication terminal device of claim 9,
    wherein the fifth circuit is configured to perform a carrier aggregation process.

11. The mobile radio communication terminal device of claim 9,
    wherein the third circuit is further configured to perform an iterative process for a predefined number of iterations, comprising:
        pre-selecting a cross-correlation coefficient from the cross-correlation coefficient vector which fulfills a predefined pre-selecting criterion;

deleting at least the pre-selected cross-correlation coefficient from the cross-correlation coefficient vector.

12. The mobile radio communication terminal device of claim 11,
wherein the third circuit is further configured to delete in at least one iteration of the iterative process at least one cross-correlation coefficient representing a neighboring frequency of the frequency of the respectively pre-selected cross-correlation coefficient.

13. The mobile radio communication terminal device of claim 9,
wherein the third circuit is configured to determine the evaluation value by determining a ratio value by dividing the respective value of the pre-selected cross-correlation coefficient by the averaging value;
wherein the fourth circuit is configured to select the one or more cross-correlation coefficients out of the pre-selected cross-correlation coefficients by determining, as to whether the ratio value fulfills a predefined criterion; and by selecting the one or more cross-correlation coefficients out of the pre-selected cross-correlation coefficients if the ratio value of the respective pre-selected cross-correlation coefficient fulfills the predefined criterion.

14. The mobile radio communication terminal device of claim 13,
wherein the third circuit is configured to determine, as to whether the ratio value fulfills a predefined criterion comprises by determining, as to whether the ratio value exceeds a predefined threshold.

15. A mobile radio communication terminal device, comprising:
a first circuit configured to determine a plurality of cross-correlation coefficients for a plurality of received digitized signals;
a second circuit configured to form a cross-correlation coefficient vector including the plurality of cross-correlation coefficients; a third circuit configured to determine an evaluation value for at least some of the plurality of cross-correlation coefficients;
wherein the third circuit is further configured to:
pre-select a predefined number of cross-correlation coefficients from the cross-correlation coefficient vector;
after the pre-selection, determine an averaging value using at least one of the non-preselected cross-correlation coefficients of the cross-correlation coefficient vector; and
determine the evaluation values based on the respective value of the pre-selected cross-correlation coefficient and the averaging value;
a fourth circuit configured to select a plurality of cross-correlation coefficients based on the determined evaluation values; and
a fifth circuit configured to perform a scan based on the selected plurality of cross-correlation coefficients.

16. The mobile radio communication terminal device of claim 15,
wherein the third circuit is configured to perform a carrier aggregation process.

17. The mobile radio communication terminal device of claim 15,
wherein the cross-correlation coefficients are part of Enhanced Universal Mobile Telecommunications System Radio Access Absolute Radio Frequency Channel Numbers (EARFCNs).

* * * * *